United States Patent

[11] 3,624,639

[72] Inventor Anthony Leonard Isaacs
London, England
[21] Appl. No. 677,217
[22] Filed Oct. 23, 1967
[45] Patented Nov. 30, 1971
[73] Assignee Thorn Electronics Limited
London, England
[32] Priority Oct. 21, 1966
[33] Great Britain
[31] 47,339/66

[54] ANALOGUE-TO-DIGITAL CONVERTER
3 Claims, 4 Drawing Figs.

[52] U.S. Cl. 340/347 AD
[51] Int. Cl. H03k 13/02
[50] Field of Search 340/347

[56] References Cited

UNITED STATES PATENTS

| | | | |
|---|---|---|---|
| 2,736,006 | 2/1956 | Langevin et al. | 340/347 |
| 2,965,891 | 12/1960 | Martin | 340/347 |
| 3,264,637 | 8/1966 | Parkinson | 340/347 |
| 3,296,612 | 1/1967 | Tomozawa | 340/347 |
| 3,239,833 | 3/1966 | Gray | 340/347 |
| 3,358,281 | 12/1967 | Masel | 340/347 |

*Primary Examiner*—Maynard R. Wilbur
*Assistant Examiner*—Charles D. Miller
*Attorneys*—Laurence Burns and Norman J. O'Malley

ABSTRACT: The present invention relates to an analogue-to-digital converter whose output is a cyclic series of pulses, the pulse count of each cycle being proportional to an analogue input signal.
The invention is useful, for example, in stage and studio lighting control systems, where the output pulses are used to control the fading of lamps and the occurrence of a burst of pulses may produce a visible step in the brightness of the lamps and it is therefore desirable for the pulses to be distributed over the cycles of the digital output.

ANTHONY LEONARD ISAACS
INVENTOR

BY Laurence Burns,
ATTORNEY

ANTHONY LEONARD ISAACS
INVENTOR
BY Lawrence Burns
ATTORNEY

ANTHONY LEONARD ISAACS
INVENTOR

BY Laurence Burns,
ATTORNEY

ANALOGUE-TO-DIGITAL CONVERTER

According to the present invention there is provided an analogue-to-digital converter comprising a discrete-level generator for providing a cyclic series of discrete signals of differing constant magnitudes, in which signals whose magnitudes are similar are separated in time over the period of the cycle of the series of discrete signals, and a comparator for comparing the magnitudes of the discrete signals with an analogue input signal to be converted to a digital signal, the comparator either providing output pulses only when a discrete signal is greater than the analogue signal, or when a discrete signal is less than the analogue signal, whereby cycles of pulses whose count depends on the analogue signal are provided at the comparator output.

The magnitudes of the discrete signals in each cycle are preferably all different, and may bear a logarithmic relationship to one another.

The discrete-level generator may comprise a counter coupled to a pulse oscillator, the counter having a number of binary stages, and each stage having a corresponding resistor which is coupled to an electrical source and the generator output when that stage is in that one of its states which represents a binary 'one'. The currents appearing at the generator output thus depend on the number counted. A load resistor may of course be used to provide a voltage output. The resistors are preferably arranged with the most significant counter stage coupled to the highest valued resistor, the next most significant counter stage coupled to the next highest valued resistor, and so on. This arrangement provides output voltages which change as the count changes through all the possible output voltages but in a sequence which does not depend on the magnitude of the signals.

The analogue signals may be applied to the digital to analogue converter cyclically in a series of time-divided channels. In this case each discrete signal lasts while a complete cycle of channels takes place. The digital output signal for each channel then appears in the successive periods allotted to that channel, and the count for each analogue signal is complete when a cycle of discrete signals has been completed.

Figure 1:
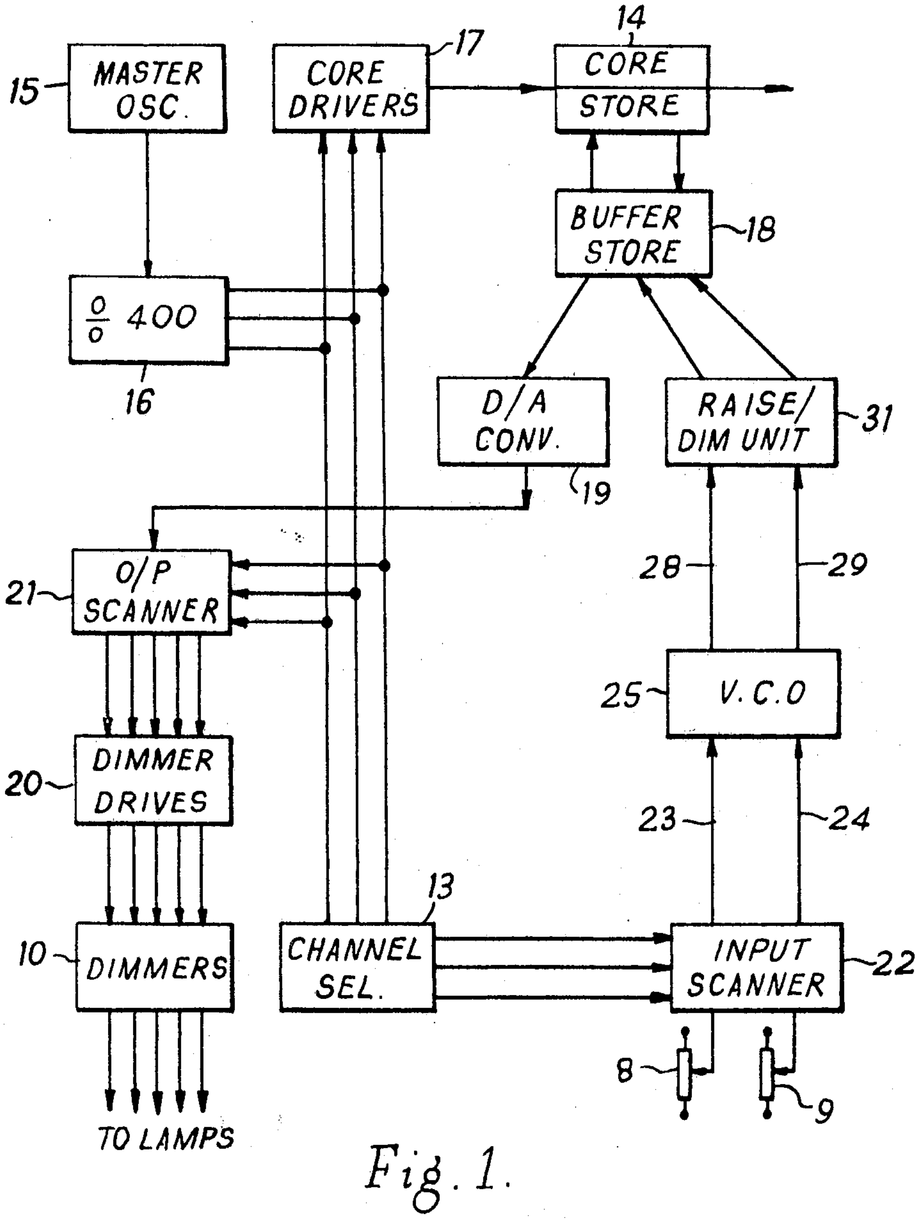
Figure 2:
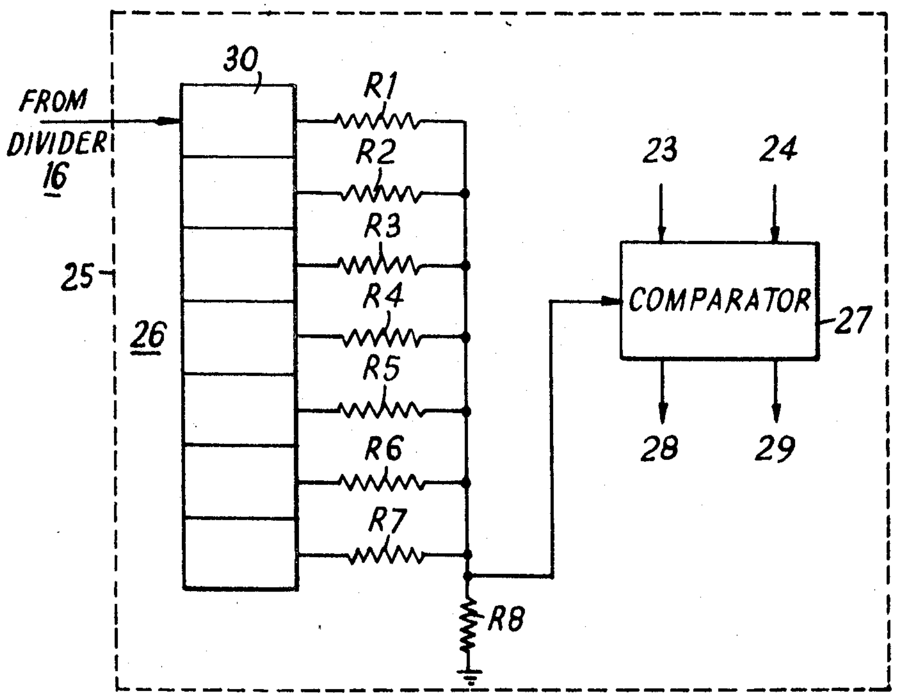
Figure 3:
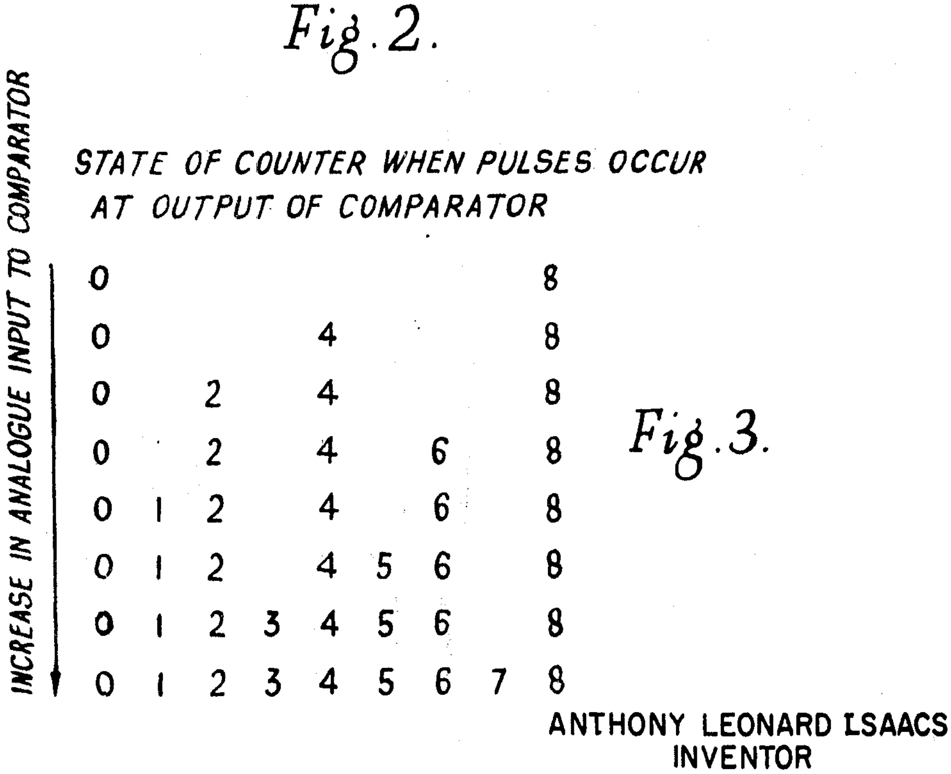
Figure 4:
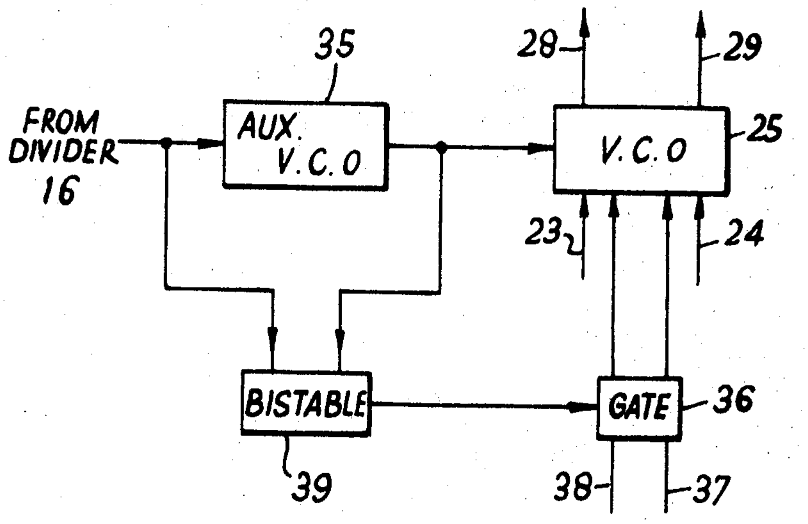

An embodiment of the invention will now be described by way of example with reference to the accompanying drawings, in which:

FIG. 1 is a block diagram of a stage lighting system including an analogue to digital converter according to the invention, FIG. 2 is a part block diagram, part circuit diagram of an analogue to digital converter according to the invention, FIG. 3 is a table showing the sequence of output pulses from the analogue to digital converter of FIG. 2, and FIG. 4 is a part of FIG. 1 modified for variable lamp fading control.

In the stage lighting system of FIG. 1 a bank 10 of dimmers controls groups of lamps (not shown). The intensity of light from any group of lamps can be changed by moving the control lever, or dolly, of one of 10 faders numbered 0 to 9, two of which, 8 and 9, are shown in FIG. 1. If a dolly is moved in one direction the brightness of a group of lamps selected by a channel selector 13 is continuously increased, at a rate depending on the position of the dolly, until the lamps are at maximum intensity. Movement of the dolly in the other direction dims the lamp continuously.

Each group of lamps is allocated a channel and eight cores in a core store 14. One of the cores registers a one-bit "on-off" signal, and the other seven register a seven-bit brightness count giving the required brightness for the group of lamps. The channels are time divided and for this purpose a 40 kc./s. master oscillator 15 supplies pulses to a divider circuit 16, having two cascaded divide-by-10 stages and two cascaded divide-by-two stages. The first divide by 10 stage gives a units output, the second divide by 10 stage gives a tens output, and the two divide-by-two stages give a four state hundreds output. The channels are numbered from 0 to 399 and have a duration of 25 microseconds. The outputs from the divider circuit are passed to core drivers 17, which at the beginning of each 25 microsecond channel period, using the conventional half current pulses applied to X- and Y-axis wires of the matrix of the store 14, select the eight cores allocated to one of the channels and transfer their contents to a buffer store 18. The contents of the buffer store is then converted to an analogue voltage by a digital to analogue converter 19. The resultant voltage is passed to a selected dimmer drive unit 20, by an output scanner 21 comprising a sampling matrix of AND gates controlled by the outputs of the divider circuit 16 feeding 400 reservoir capacitors. The sampling matrix, timed from the main divider waveforms, decommutates the 400-channel time sequential signal from the digital-to-analogue converter 19 into 400 parallel signals on the 400 reservoir capacitors. These signals, one per lighting channel, are shaped in the dimmer drive units 20 into signals controlling the 400 dimmers, one per lighting channel.

At the end of each 25 microsecond period the contents of the buffer store are read back into the core store, and the contents of the next eight cores corresponding to the next channel are read into the buffer store.

The 10 faders are used to enter the required brightness counts into the store 14 and to change them as necessary. First a channel is selected using the channel selector 13 and an input scanner 22. The 10 faders each supply an adjustable voltage to the input scanner 22. The channel selector panel has 10, 10's buttons marked 0.10.20....90 and four 100's buttons marked 0. 100, 200 and 300 respectively. There are two registers or stores in the channel selector 13, a 10 - state 10's register (stages 0, 10, 20,...80 and 90) and a four-state 100's register (stages 0, 100, 200 and 300). If the 200 button is depressed and released the '100's register is set to its 200 state, lighting a signal lamp within or near the 200 button and extinguishing all other 100's signal lamps. This condition is sustained until another 100's button is operated. If now the 70 button is depressed and released the 10's register is set to its 70 state, lighting a signal lamp within or near the 70 button and extinguishing all other 10's signal lamps. Faders 0 to 9 now operate on channels 270 to 279 respectively of the 400 channels available, controlling the lamps in lighting channels 270 to 279. If the 10's button 0 is now depressed the 10's register is set to its state O, 10's button 0 is illuminated instead of button 70 and faders 0 to 9 operate on channels 200 to 209 respectively. If 100's button 0 is next depressed the 100's register is set to 0, 100's button 0 is illuminated instead of the 200 button and faders 0 to 9 operate on channels 0 to 9 respectively.

With the channel selector set to 270, the 100's and 10's registers in the channel selector are compared in an AND gate matrix with the corresponding counters of the divider circuit 16 to produce an output pulse from the channel selector when the divider circuit is in states 270 to 279. In the input scanner 22 the units outputs of the divider circuit 16 are applied to an AND-gate matrix with the analogue voltage outputs of the 10 faders and with the outputs of the channel selector. With the 200 and 70 buttons illuminated, the combined output consists of samples from fader 0 to output when the divider is in state 270, from fader 1 output when the main divider is in state 271, etc., and from fader 9 output when the main divider is in state 279.

The output of the input scanner 22 is composed of bursts of sequential samples of the analogue voltage inputs from the faders, each taken once per divider circuit cycle, the samples occurring only in those of the 400 available channel periods corresponding to the settings of the channel selector.

Each fader is lightly biased to its mechanical center, and its operating lever or dolly is moved in one sense to raise the brightness of the lamps it controls and in the opposite sense to dim them. The input scanner has a two-wire output 23, and 24, the wire 23 only being energized by any faders moved from center-zero in the "raise" sense, the other wire 24 only being energized by any faders moved from center-zero in the "dim" sense. The sense of fader operation is thus wire encoded, not polarity encoded. The samples vary in magnitude with the displacements of the fader controls from center-zero; neither output is energized by a control set to center-zero.

A voltage-controlled oscillator (V.C.O.) 25, having the block diagram of FIG. 2 uses a 128-state counter 26 driven by a 100 c./s. waveform from the divider 16 to produce an analogue output voltage having 128 distinct levels. Each level is sustained for one complete 400-channel cycle of the divider circuit 16, so that one complete cycle of 128 analogue voltage levels lasts 1.28 seconds.

A number of resistors R1 to R7, one for each stage of the counter 26, are coupled to their corresponding stages. As the counter receives pulses the resistors are, in effect, connected to, and disconnected from, a battery (not shown) in dependence on the number of pulses received. Thus the current through a resistor R8 and hence the voltage across the resistor, varies according to the count, providing the 128 discrete levels. A comparator 27 compares these levels with the outputs of the input scanner on wires 23 and 24. If the voltage on either output lead of the input scanner is greater than that across the resistor R8 in a given channel period, the V.C.O. produces from a 40 kc./sec. input from the master oscillator 15 a pulse in that channel period on the appropriate output lead. Thus with channel 273 selected and fader 3 at its center-zero each output of the input scanner is at (or below) zero during channel period 273 of the main divider cycle, that is smaller than any of the 128 analogue voltage levels from the resistor R8. No pulse then occurs in channel period 273 from either of the two outputs 28 and 29 of the V.C.O. If the dolly of fader 3 is set fully in either the "raise" or the "dim" sense, one or other of the channel selector outputs will be greater in channel period 273 than all 128 levels of the V.C.O. counter analogue voltage, and the V.C.O. will produce a pulse at either its "raise" output 28 or its "dim" output 29 in channel period 273 of every complete cycle of the divider circuit 16. If fader No. 3 is set only midway, in either sense, one of the input scanner outputs will be greater in channel period 273 than about half of the V.C.O. analogue levels, and the corresponding V.C.O. output terminal will produce an output pulse in channel period 273 of about half of the 128 complete cycles of the main divider required to produce a complete cycle of the 128-state V.C.O. counter. The "raise" and "dim" outputs of the V.C.O. are thus sequences of pulses occurring in any given channel period at rates varying with the displacement of the relevant fader dolly from center-zero. Again the sense of displacement is wire encoded at the V.C.O. output.

The pulse rate in any given channel period determines the rate of change of brightness of the lamps in the relevant lighting channel. If the 128 levels formed a regular "staircase" waveform the V.C.O. output pulses in any channel period would occur in bursts, the individual pulses of a burst being spaced by one cycle of the divider circuit, that is 10 ms., and the burst period being one complete cycle of the V.C.O. counter, that is 1.28 seconds. Even though individual pulses produce brightness changes which are not in themselves individually discernible, bursts of, say, 10 such pulses at intervals of 1.28 seconds would produce noticeable steps in brightness.

To overcome this difficulty, the least significant counter stage 30 is connected to the most significant resistor R1, that is the resistor having the lowest resistance. Thus the difference between a conventional analogue converter using counter stages and resistors and the counter 26 and the resistors R1 to R7 is that the resistor network is transposed with respect to the counter stages. As the count in the counter 26 increases currents are passed through the resistors R1 to R7 in the following sequence:

R1,
R2,
R1 and R2,
R3,
R1 and R3, and so on.

Taking as a simple illustration an eight-state counter, the normal arrangement with R1 corresponding to the least significant output would result in a stepwise increase in output 1, 2, 1+2=3, 4, 4+1=5, and so on. When the resistors are reversed so that R1 corresponds to the most significant output the result is a sequence of output levels 4, 2, 4+2=6, 1, 1+4=5, 1+2=3, 1+2+4=7, 0, i.e. 4, 2, 6, 1, 5, 3, 7, 0. The same number of levels is produced but their magnitudes change in what may be termed a "pseudorandom" sequence. As the analogue input to the comparator 27 increases it will first exceed the level 0 of the state 0 of the counter and then the level 1 of state 4, and then the level 2 of state 2, etc. The complete table of the states of the eight-state counter for which pulses occur at different analogue input values is shown in FIG. 3. As the analogue input to the comparator 27 increases each new pulse in the comparator's output occurs midway between an existing pair of pulses, but no smaller pulse interval is halved until all greater pulse intervals have been halved.

When the brightness count of a group of lamps, represented by the states of the eight cores allocated to that group has been read into the buffer store 18, a raise/dim unit 31 raises or lowers the count at one unit per pulse received along wires 28 or 29. Thus if, for example, the fader coupled to channel 270 were in its maximum position, the count stored by the cores allocated to that channel would be increased by 128 during every cycle of the counter 26; if this fader were halfway between its maximum and center positions, the count would be increased by 64 during every cycle of the counter 26.

The relationship between fader setting and rate of change of "brightness count" may be modified by using a fader having a different relationship of output voltage to dolly position, or by deriving the 128-level V.C.O. divider analogue voltage from a "staircase" analogue made nonlinear by suitable modification of the analogue-deriving network.

As is described in detail in our copending application of the same date entitled "Improvements in Lighting Systems" (British application No. 47344/66), in one form of lighting system the V.C.O. 25 may receive analogue voltage inputs from apparatus controlling the fading of lamps allocated to some or all channels. The rate of fading depends on the difference between the initial lamp brightness and the required lamp brightness, since the pulse output from the V.C.O. depends on an analogue voltage dependent on this difference. Hence all fade operations are completed in the same time.

In order to vary fade times as desired an auxiliary V.C.O. 35 (see FIG. 4) may be interposed in the connection between the 100 c./s. output of divider 16 and the V.C.O. 25 to control the rate at which pulses are supplied to the counter 26 of the V.C.O. 25. It is necessary to add logic to the V.C.O. 25 to ensure that it produces only one output pulse per channel per input pulse from the auxiliary V.C.O. 35. Such logic may consist, for example, of a gate 36 controlling 40 kc./sec. inputs 37 and 38, from the master oscillator 15 to the V.C.O. 25, the gate being enabled when a bistable circuit 39 is set at the start of a new cycle of channels by the output of the auxiliary V.C.O. 35. The bistable circuit is reset at the end of this cycle of channels by the 100 c./s. output from the divider 16. Thus the 40 kc./s. gate is enabled for one cycle of channels only following an input pulse to the V.C.O. 25 and the generation of a new analogue level.

For a sequence of 128 pulses from the divider 16, each of which formerly changed the level of the analogue input to the comparator 27 of the V.C.O. 25, the auxiliary V.C.O. 35 supplies to the V.C.O. 25 a lesser number of pulses determined by a control input. In consequence the complete cycle of 128 states of V.C.O. 25 takes a longer time and the output frequency in each channel is reduced in the same proportion, namely the "division ratio" of the auxiliary V.C.O. 35. This division ratio may be varied by varying the auxiliary V.C.O. control input to give overall control of fade time. The control input may be set manually or may be the analogue output of a channel reserved for such use.

If the auxiliary V.C.O. analogue levels are based on a linear staircase the fade rates, being directly proportional to the V.C.O. output frequency, are proportional to the auxiliary V.C.O. control voltage. If the manual control for this voltage is linear or if a linear voltmeter is used to indicate the control voltage, and hence the selected fade time either may be calibrated in fade time but scale shapes will be cramped at the "slow" (minimum voltage) end of the control range because of the inverse control law. Since fade time varies inversely with auxiliary V.C.O. output frequency the control law is hyperbolic.

The auxiliary V.C.O. 35 produces an output pulse whenever its control voltage is, say, greater than the prevailing one of its 128 distinct levels. The ratio $f/F$ of its actual output frequency $f$ to its maximum possible output frequency F is equal to the proportion $n/N$ of the $n$ analogue levels less than or equal to the control voltage $v$ to the total number N of differing analogue levels, i.e. $f/F=n/N$. If a. the related staircase waveform is linear, b. the maximum control voltage and the maximum analogue level are each V, and c. the actual control voltage is $v$, then $f/F=n/N=v/V$, i.e. the output frequency in any channel is proportional to the channel control voltage.

If the analogue levels of the auxiliary V.C.O. are based on a logarithmic staircase, i.e. $l/H=k \log n/N$, where $l$ is the level of the $n$th step and $L$. is that of the $n$th step of the related staircase, for a control voltage $v$ which is a fraction $v/V$ of the maximum control voltage $V$, $v/V=l/L\ k \log n/N=k \log f/F$, or $f/F=e^{k(v/V)}$, i.e. the frequency ratio is an exponential function of the control voltage. Fade time is inversely proportional to the auxiliary V.C.O. output frequency, hence the ratio $t/T$ of actual fade time $t$ to minimum fade time T is given by $t/T=F/f=-v/kV$ : This gives a "reverse exponential" scale shape to the voltmeter or the manual control, or a direct exponential scale shape if the meter or the control connections are reversed. Such a scale shape has the advantage that its discrimination or readability is in constant proportion to its setting. Thus the use in the auxiliary V.C.O. controlling overall fade time of an analogue waveform based on a logarithmic sequence of levels has the advantage of providing a scale shape for the fade time control or indicator having a reading accuracy which is a constant fraction of the fade time set or indicated.

The relationship between the levels of the output signals provided by the counter 26 and the resistors R1 to R8 is preferably arithmetic in the V.C.O.25 and logarithmic in the V.C.O.35.

A meter is associated with each fader and is controlled with it by the channel selector and input and output scanners to indicate the brightness count in the channel on which the fader operates. Two channel may be allocated to give meter indication of the progress of a fade, one indicating "fade up" progress and the other "fade down" progress, since the rates for these may be chosen independently. Since a selected fade time applies to all channels changed in that sense the metering channels may be arranged to count over an arbitrary range and the meters monitoring the decommutated analogue outputs for these channels may be scaled in "percent completion" of fade. The metering counters are set to their starting states by operation of any appropriate selector button, e.g. "add," "fade."

The V.C.O.25 may be divided into two parts one for raising brightness and one for dimming brightness. Each part has separate connections to the divider 16. Two auxiliary V.C.O's may then be connected in the separate connections to give fast raise, slow dim, or slow raise, fast dim operation. Several auxiliary V.C.O's may be used in each separate connection to give fixed and variable fade time control.

Very slow rates of change for prolonged "sunrise" or "sunset" effects may be obtained using auxiliary V.C.O.'s.

I claim:

1. An analogue-to-digital converter comprising:

a. a discrete-level generator generating a cyclic series of discrete signals of differing constant magnitudes, in which signals whose magnitudes are similar are separated in time over the period of the cycle of the series of discrete signals, said generator comprising
   a counter having a number of binary stages,
   a group of resistors each corresponding to one of the stages of the counter,
   electrical source means,
   a generator output terminal,
   means coupling the stages of the counter to the resistors, the most significant counter stage being coupled to the highest valued resistor and the less significant stages being coupled to resistors of progressively lower values, whereby when a counter stage is in its binary "one" state the corresponding resistor is connected between said electrical source means and said generator output terminal, and
   a pulse oscillator coupled to said counter; and b. a comparator coupled to said generator and to the analogue input to compare the magnitudes of the discrete signals with an analogue input signal to be converted to a digital signal,
   said comparator being constructed to provide an output pulse only when a discrete signal is less than, or only when it is greater than, the analogue signal, whereby cycles of pulses whose count depends on the analogue signal are provided at the comparator output.

2. A converter as claimed in claim 1 including means for applying analogue signals to the converter in a series of time-divided channels and for controlling the discrete-level generator to maintain each discrete level for a complete cycle of the said channels.

3. A converter as claimed in claim 1 wherein the pulse oscillator is coupled to means for applying a group of analogue signals to the converter in a series of time-divided channels, the duration of each of the discrete levels of the generator corresponding to a complete cycle of the said channels.

* * * * *